United States Patent [19]

Goldie et al.

[11] 4,251,786

[45] Feb. 17, 1981

[54] STEPPED-ROD FERRITE MICROWAVE LIMITER HAVING WIDE DYNAMIC RANGE AND OPTIMAL FREQUENCY SELECTIVITY

[75] Inventors: Harry Goldie, Randallstown; Steven N. Stitzer, Ellicott City, both of Md.

[73] Assignee: The United States of America as represented by the Secretary of the Air Force, Washington, D.C.

[21] Appl. No.: 55,425

[22] Filed: Jul. 6, 1979

[51] Int. Cl.³ .......................... H01P 1/218; H01P 1/23
[52] U.S. Cl. .................................... 333/17 L; 333/219
[58] Field of Search ..................... 333/17 L, 24.2, 219

[56] References Cited

U.S. PATENT DOCUMENTS 3,500,256   3/1970   Carter et al. ...................... 333/17 L Primary Examiner—Paul L. Gensler
Attorney, Agent, or Firm—Donald J. Singer; Robert Kern Duncan

[57] ABSTRACT

A coaxial line, wide dynamic range, ferrite limiter having optimal frequency selectivity for microwave frequencies is provided by a stepped ferrite rod with disks of varying volumes and dielectric constants controlling the operating frequency and threshold level for each step segment.

5 Claims, 1 Drawing Figure

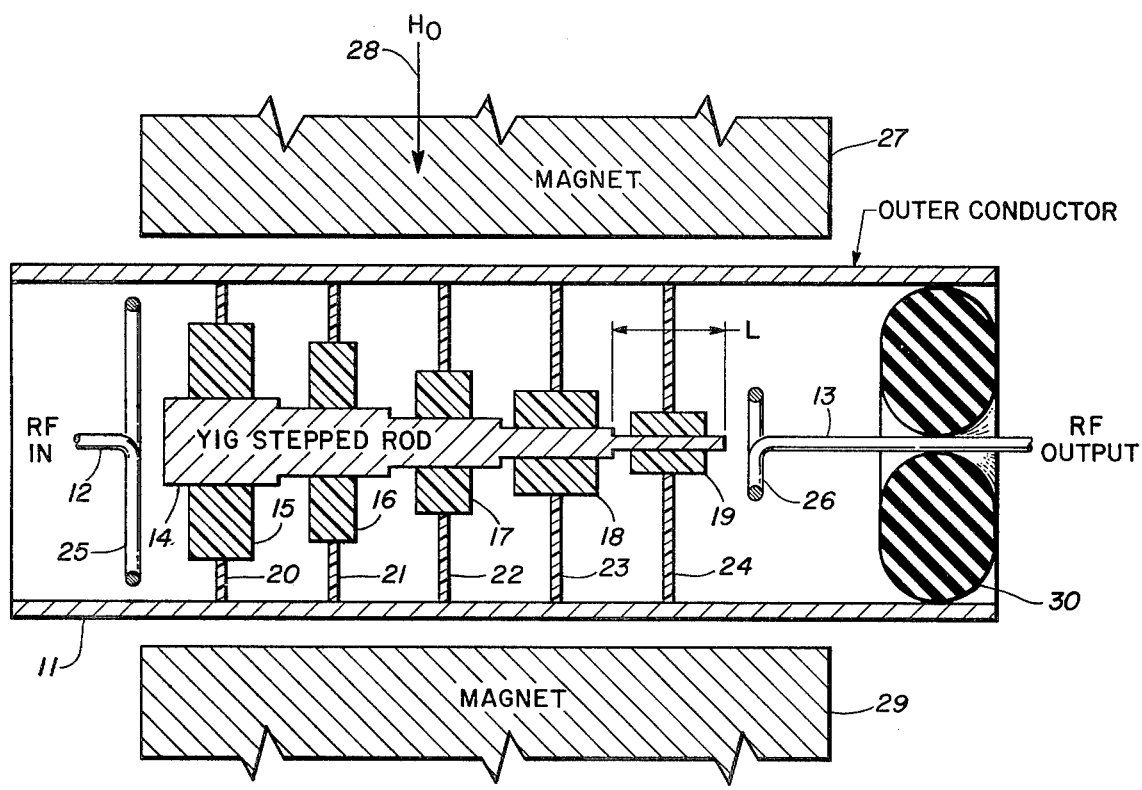

STEPPED-ROD FERRITE MICROWAVE LIMITER HAVING WIDE DYNAMIC RANGE AND OPTIMAL FREQUENCY SELECTIVITY

RIGHTS OF THE GOVERNMENT

The invention described herein may be manufactured and used by or for the Government of the United States for all governmental purposes without the payment of any royalty.

BACKGROUND OF THE INVENTION

The use of ferrite material, such as, yttrium-iron-garnet, to provide frequency selective limiting is well known. The advantages of subsidiary resonance limiting is also recognized in the prior art.

The closest, best known prior art is believed to be found in the following references: U.S. Pat. No. 3,906,404 to patentee Dixon, Jr.; U.S. Pat. No. 4,027,256 to patentee Dixon; publication "Interaction of Signals in Ferromagnetic Microwave Limiters" by P. R. Emtage and S. N Stitzer in IEEE Transactions on Microwave Theory and Techniques, Vol. MTT-25, No. 3, March 1977, pp. 210-213; and publication "YIG Rod Ferrite Limiter with Extended Dynamic Range" by Samuel Dixon, Jr., in IEEE Transactions on Magnetics, Vol. MAG-14, No. 1, January 1978, pp. 28-30.

BRIEF SUMMARY OF THE INVENTION

A stepped-diameter ferrite rod having dielectric resonant disks of varying size and dielectric constant, provides a frequency-selective limiter which has wide instantaneous bandwidth, subsidiary resonance mode biasing for low threshold, sharp frequency selectivity above threshold and wide dynamic range.

BRIEF DESCRIPTION OF THE DRAWING

The single FIGURE of the drawing schematically illustrates a sectional view of a typical coaxial stepped-rod limiter comprising an embodiment of the invention.

DESCRIPTION OF THE PREFERRED EMBODIMENT

A typical embodiment of the invention is illustrated in the FIGURE of the drawing. The structure is coaxial (except for the dc field magnet) with outer conductor 11 and center conductors 12 and 13 carrying the propagating (left to right) microwave radio frequency energy into and out of the device. The ferrite rod 14 is sequentially reduced in diameter at each resonator stage with the smallest diameter at the output port. Thus, the ferrite volume is smallest for the stage that sees the smallest rf power level and which requires the tightest of coupling to the ferrite rod. The stepped ferrite rod 14, having step lengths L, is supported by the varying size, varying dielectric constant, resonant disks 15, 16, 17, 18 and 19 which in turn are supported in the electrically conductive, non-magnetic, cylindrical outer conductor 11 by the thin epoxy disks 20, 21, 22, 23 and 24. Resonant disks are typically fabricated of rutile, strontium titanate and similar materials. Each dielectric disc, (e.g., 15, 16, 17, 18, and 19) is positioned on a respective step of length "L" of the stepped ferrite rod 14, and cooperates with the propagating microwave and the magnetic field 28 to constitute a tuned resonant circuit commonly referred to as a resonant stage of the device. The drawing illustrates a five-stage device. The input and output conductors 12 and 13 are conventionally supported in the coaxial line by conventional rexolite beads 30. It is necessary that the dielectric disk dimension vary in order that each disk maintain the same resonant frequency. It is also required the disk holes be correspondingly smaller to encircle each rod segment in such a manner as to increase the RF magnetic field magnification in the ferrite in successive stages. It has also been found desirable that the disk dielectric constants be varied along with the disk dimensions in order to increase the RF field intensity at the disk center line and maintain the design resonant frequency.

Conventional impedance transforming loops 25 and 26 couple the energy into and out of the device to the center conductor of the coaxial line, and conventional dc magnet having poles 27 and 29 supplies substantially parallel, transverse dc magnetic field 28 (i.e., a field of parallel magnetic lines with the lines of the field transverse to the general axis of the device) that biases the ferrite rod 14 to the subsidiary resonance state. (Typically, approximately 2000 Gauss for a typical x-band system.)

It has been found that generally it is desirable that the threshold steps of the stepped-diameter rod increase with increasing rod diameter approximately 10 to 15 db per step for optimal dynamic range and sharpest selectivity. The largest diameter segment at the input end will handle tens of watts of cw power while the small diameter rod segment at the output port limits the output power to less than approximately 5 mW. Instantaneous stop bands of approximately 10 MHz and operating bandwith of over a GHz are typical values for operating devices.

To further aid in the teaching for the practice of the invention, a brief mathematical analysis of the invention follows. The frequency selectivity bandwith, $\Delta f$ of a typical ferrite limiter comprising N cascaded stages, for $\alpha(dB)$ of weak signal compression, is given by $$\Delta f_{\alpha(dB)} = \frac{8.25}{\sqrt{\alpha(dB)}} \Delta H_K(O_e) \sqrt{\sum_{i=1}^{N} \phi_i^2} \quad (MHz)$$

where $\Delta H_{Kth}$ is the YIG spinwave linewidth and the excess power parameter $\phi_i$ for the i stage is $$\phi_i^2 = \frac{P_{ini} - P_{outi}}{P_{thi}} \left. \begin{array}{l} P_{ini} = \text{input power} \\ P_{outi} = \text{output power} \\ P_{thi} = \text{threshold power} \end{array} \right\} i^{th} \text{ stage}$$

(dB) indicates $\alpha$ in decibels
($O_e$) indicates $\Delta H_k$ in Oersteds
N is number of stages Optimal selectivity occurs when $N \to \infty$ (as in a long limiter with continuously graded threshold). For a finite number of stages, (i.e., two or more), narrowest selectivity bandwidth obtains when each stage operates at a fixed ratio of input-to-threshold power, i.e., constant $\phi$ in each stage.

A second reason for reducing the threshold in successive stages in a ferrite limiter is that a given volume ferrite sample will limit most effectively over a restricted range of power levels. The upper limit is set by the volume of ferrite, while the lower limit is set by the degree of coupling between the ferrite and the resonator.

The relationship between the limiting threshold and the physical size of the resonator may be found by equating two definitions of the loaded Q of a resonator. The two definitions are in terms of the energy stored/lost and the center frequency/bandwidth:

$$Q_L = \frac{\text{total energy stored}}{\text{energy lost per cycle}} = \frac{f_o}{\Delta f_{3db}}$$

$$= \frac{\frac{\mu o}{2} \int V_{resonator} |h_{rf}|^2 dV}{P_{in}/f} = \frac{f_o}{\Delta f_{3dB}}$$

where $\mu_o$ is the permeability of the dielectric (free space), V is the volume of the resonator, and $f_o$ is the signal frequency.

The threshold power is the value of $P_{in}$ which produces $h_{rf} = h_{crit}$.

$$P_{in} = \frac{\mu o}{2} V_{resonator} |h_{rf}|^2 dV \Delta f_{3dB}$$

$$P_{th} = \frac{\mu o}{2} h_{crit}^2 \int \frac{|h_{rf}|^2}{h_{crit}^2} dV \Delta f_{3dB}$$

$$= \frac{\mu o}{2} h_{crit}^2 K V_{resonator} \Delta f_{3dB}$$

where K is a function of the resonator geometry, $h_{rf}$ is the RF magnetic field, and $h_{crit}$ is the RF magnetic field where limiting occurs.

In a multiple stage limiter where each resonator is geometrically similar, the threshold in each stage is proportional to the physical volume of the stage. The input stage would be large, as required to dissipate the high input power. Output stages are smaller, which is compatible with the fact that less power must be dissipated in them.

The maintaining of approximately a constant ratio of applied power to threshold power in each stage, by changing the dimensions of each separate resonator in a multiple stage limiter, may readily be accomplished by considering the following design criteria.

The dominant resonant frequency of the cylindrical dielectric resonators may be expressed by $$f = \frac{2.405\,c}{\pi D} (\epsilon_r \mathrm{Sin}^2(\frac{\pi \delta}{2}) + \cos^2(\frac{\pi \delta}{2}))^{-\frac{1}{2}}$$

where c is the speed of light in vacuum, D is the resonator diameter, $\epsilon_r$ is the relative dielectric constant of the resonator material, and the fractional wavelength of the resonator is $$\delta = \frac{2fL}{c} (\epsilon_r - 1)^{\frac{1}{2}} \cos(\frac{\pi \delta}{2})$$

where L is the length of the resonator. The above two equations can be combined as follows:

$$\frac{L}{D} = \frac{\pi \delta}{2(2.405)} \frac{(\epsilon_r \mathrm{Sin}^2(\frac{\pi \delta}{2}) + \cos^2(\frac{\pi \delta}{2}))^{\frac{1}{2}}}{(\epsilon_r - 1)^{\frac{1}{2}} \cos(\frac{\pi \delta}{2})}$$

For high dielectric constant material, $\epsilon_r \gg 1$, and the above equation can be approximated as $$\frac{L}{D} = \frac{\pi \delta}{2(2.405)} \tan(\frac{\pi \delta}{2})$$

for reasonable values of $\delta$. Greatest separation from adjacent resonant modes occurs for $L/D \approx 0.4$. Solving the above equation for this value of $L/D$, results in $\delta = 0.54$. The dimensions of the resonators can then be found from the original pair of equations. Inserting in the values of $L/D$ and $\delta$ found above, we have

| | |
|---|---|
| $L = 4.822/(\epsilon_r - 1)^{\frac{1}{2}} f(\mathrm{GHz})$ | inches |
| $D = 2.5\,L$ | inches |

As an example, for a three stage limiter at 9.375 GHz, using alumina, $TiO_2$, and $SrTiO_2$ for the three resonators, we find the dimensions given in the table below

| | | | | | |
|---|---|---|---|---|---|
| (Input) | 1 | $Al_2O_3$ | 10 | .1714 | .4286 |
| | 2 | $TiO_2$ | 100 | .0517 | .1292 |
| (Output) | 3 | $SrTiO_3$ | 230 | .0340 | .0850 |

These equations do not account for the small hole through the center of the resonator for the YIG material, but this will make only a relatively small difference in the actual dimensions used.

Thus, the size of successive stages in a multiple stage limiter may be decreased and still provide a constant ratio of input to threshold power throughout the limiter by changing the material of the dielectric resonators which results in a limiter having optimum frequency selectivity.

We claim:

1. A ferrite limiter for a propagating microwave comprising:
   a. a stepped ferrite rod having a first diameter and a second diameter smaller than the said first diameter;
   b. a first dielectric disk resonator having a predetermined resonant frequency positioned in coaxial relationship on the said first diameter of the stepped ferrite rod;
   c. a second dielectric disk resonator having a predetermined resonant frequency that is substantially the same frequency as that of the said first dielectric resonator, positioned in coaxial relationship on the said second diameter of the stepped ferrite rod;
   d. means for coupling the said microwave into and out of the said stepped ferrite rod; and
   e. means cooperating with the said microwave for biasing the said first and said second dielectric resonators to subsidiary resonance.

2. A multiple stage microwave ferrite limiter biased to subsidiary resonance and having an input power and a threshold power for each stage, the said limiter comprising a plurality of successive stages, having the same resonant frequency, of decreasing size wherein the said decreasing stage size is fabricated to provide a constant ratio of input to threshold power for each stage throughout the said limiter.

3. A multi-stage ferrite limiter for microwave energy of a predetermined radio frequency propagating in a coaxial wave guide having an outer conductor and a center conductor, the said limiter comprising:
   a. a stepped ferrite rod having an input and an output end and a plurality of substantially uniform steps of decreasing diameter from the said input end to the said output end;
   b. a plurality of decreasing in volumetric size dielectric resonator disks in one-to-one correspondence with the said plurality of ferrite rod steps, and with each of the said resonator disks positioned concentrically around a respective step in the said ferrite rod, the said resonator disks positioned progressively with the largest disk on the largest step to the smallest disk on the smallest step;

c. means for concentrically positioning the said dielectric resonator disks in the said coaxial waveguide with decreasing resonator size in the direction of the said propagating microwave energy;

d. means including a first transforming loop for coupling the said propagating microwave energy from the said center conductor into the said input end of the said stepped ferrite rod;

e. means including a second transforming loop for coupling the said propagating energy passing through the said ferrite limiter from the said output end of the said ferrite rod to the center conductor of the said coaxial waveguide; and f. means for providing a dc magnetic field of transverse, substantially parallel lines, through the said ferrite limiter whereby each of the said plurality of dielectric resonators resonates in the subsidiary resonance mode at substantially the said predetermined radio frequency.

4. The ferrite limiter as claimed in claim 3 wherein the said stepped ferrite rod is fabricated from yttrium-iron-garnet.

5. The ferrite limiter as claimed in claim 4 wherein the said volumetric size of the individual dielectric resonators, the dielectric constant of the individual said resonators, and the coupling of the said resonators to the said stepped ferrite rod provides a substantially constant ratio of input power to threshold power for all resonator stages.

* * * * *

UNITED STATES PATENT AND TRADEMARK OFFICE
CERTIFICATE OF CORRECTION

PATENT NO. : 4,251,786
DATED : February 17, 1981
INVENTOR(S) : Harry Goldie et al.

It is certified that error appears in the above—identified patent and that said Letters Patent is hereby corrected as shown below:

Col 2, line 44, change "$\Delta H_{Kth}$" to -- $\Delta H_K$ --.

Col 2, line 50, after "$\phi_i^2$" insert -- = --.

Col 3, line 20, in the equation change "$V_{resonator}$" to -- $\int_{V_{resonator}}$ --.

Col 4, line 2, change "0.4.$^2$" to -- 0.4. --.

Col 4, line 15, in the table, insert the following headings above the columns:

-- Stage -- above the numeral "1";

-- Material -- above "$Al_2O_3$";

-- $\epsilon_r$ -- above "10";

-- L(inches) -- above ".1714"; and

-- D(inches) -- above ".4286".

Signed and Sealed this

Fourteenth Day of July 1981

[SEAL]

*Attest:*

*Attesting Officer*

GERALD J. MOSSINGHOFF

*Commissioner of Patents and Trademarks*